United States Patent
Wen et al.

(10) Patent No.: US 8,643,525 B1
(45) Date of Patent: Feb. 4, 2014

(54) MULTIPLE OUTPUT DYNAMIC ELEMENT MATCHING ALGORITHM WITH MISMATCH NOISE SHAPING FOR DIGITAL TO ANALOG CONVERTERS

(71) Applicant: Avnera Corporation, Beaverton, OR (US)

(72) Inventors: Jianping Wen, Beaverton, OR (US); Amit Kumar, Portland, OR (US); Garry N. Link, Pacific City, OR (US); Wai Laing Lee, Austin, TX (US)

(73) Assignee: Avnera Corporation, Beaverton, OR (US)

( * ) Notice: Subject to any disclaimer, the term of this patent is extended or adjusted under 35 U.S.C. 154(b) by 0 days.

(21) Appl. No.: 13/733,301

(22) Filed: Jan. 3, 2013

(51) Int. Cl.
H03M 1/66 (2006.01)

(52) U.S. Cl.
USPC .......................................... 341/144; 375/252

(58) Field of Classification Search
USPC .................. 341/144, 142, 118; 375/252, 254
See application file for complete search history.

(56) References Cited

U.S. PATENT DOCUMENTS

| | | | |
|---|---|---|---|
| 6,348,884 B1 | 2/2002 | Steensgaard-Madsen | |
| 6,469,648 B2 | 10/2002 | Nakao et al. | |
| 6,690,313 B1 | 2/2004 | McKay et al. | |
| 6,762,702 B2 | 7/2004 | Kwan | |
| 6,952,123 B2 | 10/2005 | Kizer et al. | |
| 7,916,058 B1 * | 3/2011 | Balachandran | 341/144 |
| 8,094,052 B2 | 1/2012 | Dabag et al. | |
| 2005/0040979 A1 | 2/2005 | Brooks et al. | |

FOREIGN PATENT DOCUMENTS

| | | |
|---|---|---|
| EP | 1179889 A1 | 2/2002 |
| TW | 200424887 | 11/2004 |

OTHER PUBLICATIONS

R.T. Baird et al., "Improved ΔΣ DAC linearity using data weighted averaging," Proc. IEEE International Symposium on Circuits and Systems, May 1995, vol. 1, pp. 13-16.

* cited by examiner

Primary Examiner — Joseph Lauture
(74) Attorney, Agent, or Firm — Ater Wynne LLP (57) ABSTRACT

A system and method dynamically selects digital-to-analog (DAC) circuit elements to provide a True differential-output delta-sigma (ΔΣ) DAC. The sign and magnitude of a received N-bit input code is determined. If the input code comprises a positive value, m+r circuit elements are selected from a plurality of circuit elements by a positive element selector, in which comprises a number of rotational elements, and r circuit elements are selected by a negative element selector. Each selected circuit element comprises a circuit element that was not selected for an immediately preceding received input code and has a corresponding minimum usage count value. If the input digital code comprises a negative value, m+r circuit elements are selected by the negative element selector, and r circuit elements are selected by the positive element selector. The circuit elements are capable of being configured as positive or negative circuit elements.

20 Claims, 10 Drawing Sheets

MULTIPLE OUTPUT DYNAMIC ELEMENT MATCHING ALGORITHM WITH MISMATCH NOISE SHAPING FOR DIGITAL TO ANALOG CONVERTERS

BACKGROUND

The subject matter disclosed herein relates to a system and method for dynamically selecting circuit elements. More particularly, the subject matter disclosed herein relates to a system and method for dynamically selecting circuit elements to improve linearity of a low-noise, low-power delta-sigma ($\Delta\Sigma$) digital-to-analog converter (DAC).

During digital-to-analog (D/A) conversion, a thermometer code is generated that corresponds to an input digital sample. The thermometer code then is used to select a number of DAC elements that scale the input digital sample in the analog domain. For a D/A conversion process to be linear, the DAC elements are assumed to all be identical. In reality, however, mismatches among DAC elements exist and conventional DAC element-selection schemes produce code-dependent errors that are manifested as a conversion distortion.

A conventional Data Weight Average (DWA) algorithm is typically used to whiten the code-dependent errors as well as provide a first-order mismatch noise shaping, thereby moving most of the resulting white-noise power beyond the signal band. (See, for example, R. T. Baird, and T. S. Fiez, "Improved $\Delta\Sigma$ DAC linearity using data weighted averaging," Proc. IEEE International Symposium on Circuits and Systems, May 1995, Vol. 1, pp. 13-16). The first-order mismatch noise shaping of this algorithm is a result of the requirement that the number of selected DAC elements linearly scale the input digital sample code. Accordingly, to implement this algorithm with first order mismatch noise shaping, a signed input code set must first be linearly mapped to a non-negative code set because a code sign change cannot be linearly handled by a conventional DWA element rotation algorithm.

Figure 1:
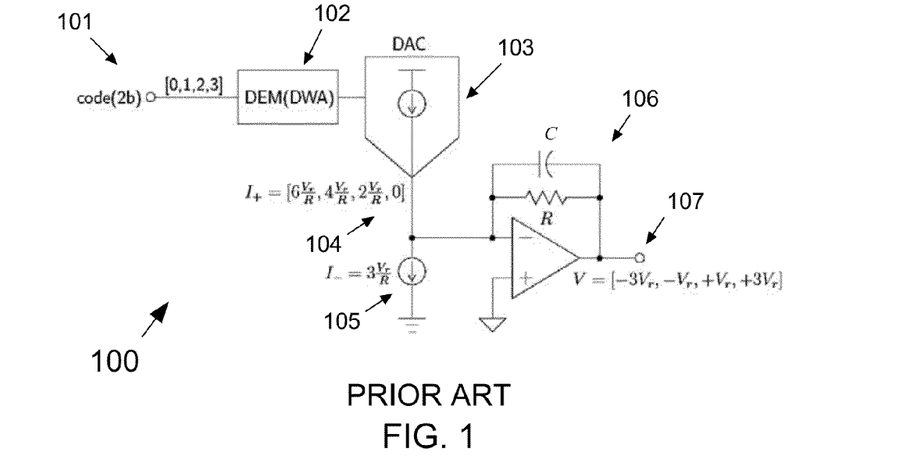
FIG. 1 depicts an exemplary functional block diagram of a conventional single-ended DAC configuration that implements a conventional DWA algorithm.

Consider, for example, an input signed 2-bit digital code set [−3, −1, +1, +3] that is to be converted to the corresponding analog output values of [−3V, −1V, +1V, +3V]. FIG. 1 depicts an exemplary functional block diagram of a conventional single-ended DAC configuration 100 that implements a conventional DWA algorithm. The signed code set is initially converted into a non-negative code, such as,

[−3, −1, +1, +3]→[0, 1, 2, 3].

At 101 in FIG. 1, the signed input 2-bit digital code set [−3, −1, +1, +3] has already been converted into the non-negative code [0, 1, 2, 3] in a well-known manner and is not shown. At 102, a conventional DWA algorithm is implemented to provide dynamic element matching (DEM). DAC 103 (of which only one DAC element of a plurality of DAC element are shown) is selected by the DEM 102 and the non-negative code is converted as

[0, 1, 2, 3]→[6$V_r$/R, 4$V_r$/R, 2$V_r$/R, 0], in which $V_r$ is a reference voltage, and $V_r$/R is a reference current corresponding to reference voltage $V_r$. That is, DAC element 103 outputs currents [6$V_r$/R, 4$V_r$/R, 2$V_r$/R, 0] respectively corresponding to the non-negative code [0, 1, 2, 3] at 104. The non-negative code set is re-centered by adding a DC offset that is provided by current source 105. At 107, filter 106 outputs re-centered code [−3$V_r$, −$V_r$, +$V_r$, +3$V_r$].

Although a conventional DWA algorithm reduces the in-band mismatch noise by a first-order noise shaping, adding a DC offset, such as shown in FIG. 1, injects unnecessary noise into the DAC output. Moreover, extra power is wasted because the circuitry performing the DC offset is not part of the DAC output signal.

Figure 2:
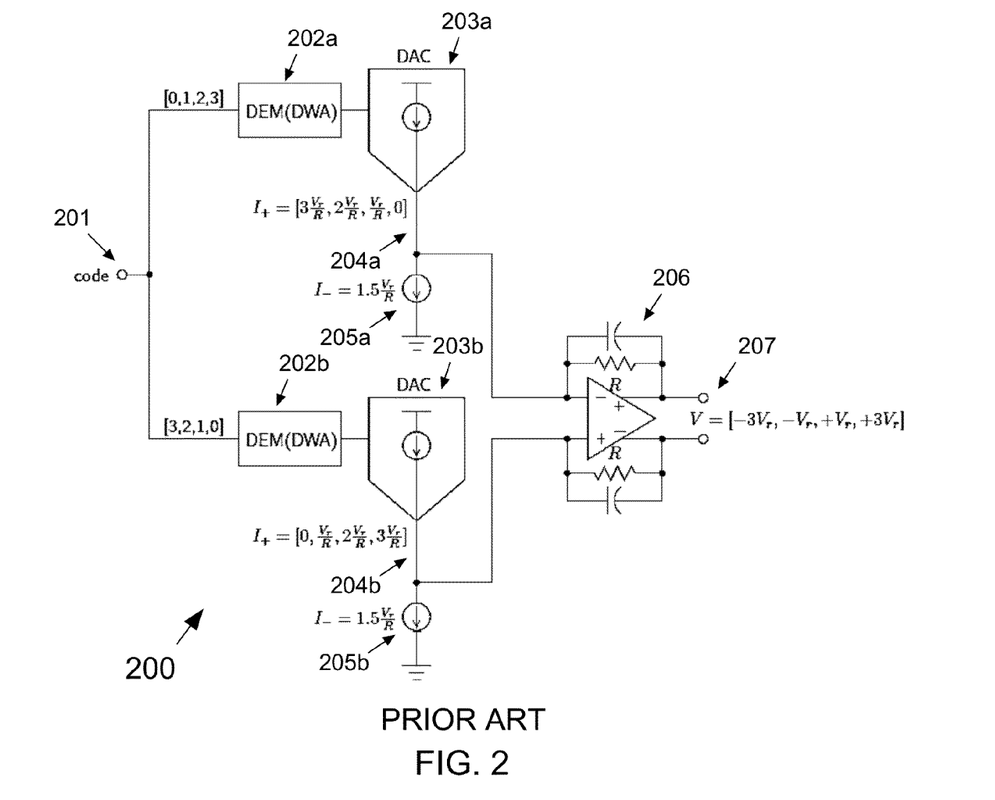
FIG. 2 depicts an exemplary functional block diagram for a conventional pseudo-differential DAC configuration.

For a high-performance DAC system, two identical DACs are conventionally used to form a pseudo-differential DAC. FIG. 2 depicts an exemplary functional block diagram for a conventional pseudo-differential DAC configuration 200. At 201 in FIG. 2, a signed input 2-bit digital code set [−3,−1,+1,+3] has already been converted into two non-negative code sets [0, 1, 2, 3] and [3, 2, 1, 0] in a well-known manner and is not shown. A conventional DWA algorithm is implemented twice at 202a and 202b to provide dynamic element matching (DEM). DACs 203a and 203b (of which only one DAC element of a plurality of DAC elements is shown in each case) respectively provide DAC currents [3$V_r$/R, 2$V_r$/R, $V_r$/R, 0] and [0, $V_r$/R, 2$V_r$/R, 3$V_r$/R] at 204a and 204b. The two non-negative code sets are respectively re-centered by adding DC offsets at 205a and 205b. At 207, differential filter 206 outputs the re-centered code [−3$V_r$, −$V_r$, +$V_r$, +3$V_r$] as a pseudo-differential DAC output.

A conventional pseudo-differential DAC configuration, similar to the conventional single-ended DAC configuration of FIG. 1, is not power or area efficient, and the offset currents degrade the signal-path noise performance. Additionally, the conventional circuitry providing DC offsets inject additional thermal noise into the signal path.

BRIEF DESCRIPTION OF THE DRAWINGS

The subject matter disclosed herein is illustrated by way of example and not by limitation in the accompanying figures in which like reference numerals indicate similar elements and in which.

DETAILED DESCRIPTION

The subject matter disclosed herein relates to a system and method for dynamically selecting circuit elements for various types of circuits, such as Digital-to-Analog Converters (DACs), delta-sigma (ΔΣ) DACs, analog-to-digital converters (ADCs), ΔΣ ADCs, filters, etc. More specifically, the subject matter disclosed herein relates to a technique for generating multiple selectors signals for dynamic element matching (DEM) of circuit elements for signed input code sets. Each selector independently controls one group of circuit elements so that the output sequence from the selected group of circuit elements will have the first-order mismatch noise shaping. Additionally, for differential-output DACs, the subject matter disclosed herein uses a single bank of circuit elements in contrast to the conventional use of two banks of circuit elements. Moreover, the subject matter disclosed herein does not require separate circuitry for generating a DC offset. Further still, the techniques disclosed herein provide a corresponding DEM-DAC system that is both area and power efficient, and has a low thermal noise floor.

Although the subject matter disclosed herein relates to various types of circuits, such as Digital-to-Analog Converters (DACs), delta-sigma (ΔΣ) DACs, analog-to-digital converters (ADCs), ΔΣ ADCs, filters, etc., for clarity, the technique of the subject matter disclosed herein are described in connection with specific examples and configurations of ΔΣ DACs. A specific exemplary embodiment is disclosed herein that relates to a 4-bit high-performance differential-output ΔΣ audio DAC that uses two selectors; however, it should be understood that the DEM technique disclosed herein can be applied to other types of DACs and ADCs in which additional selectors are used.

As used herein, the word "exemplary" means "serving as an example, instance, or illustration." Any embodiment described herein as "exemplary" is not to be construed as necessarily preferred or advantageous over other embodiments. Additionally, it will be appreciated that for simplicity and/or clarity of illustration, elements illustrated in the figures have not necessarily been drawn to scale. For example, the dimensions of some of the elements may be exaggerated relative to other elements for illustrative clarity. Further, in some figures only one or two of a plurality of similar elements indicated by reference characters for illustrative clarity of the figure, whereas all of the similar element may not be indicated by reference characters. Further still, it should be understood that although some portions of components and/or elements of the subject matter disclosed herein have been omitted from the figures for illustrative clarity, good engineering, construction and assembly practices are intended.

Figure 3:
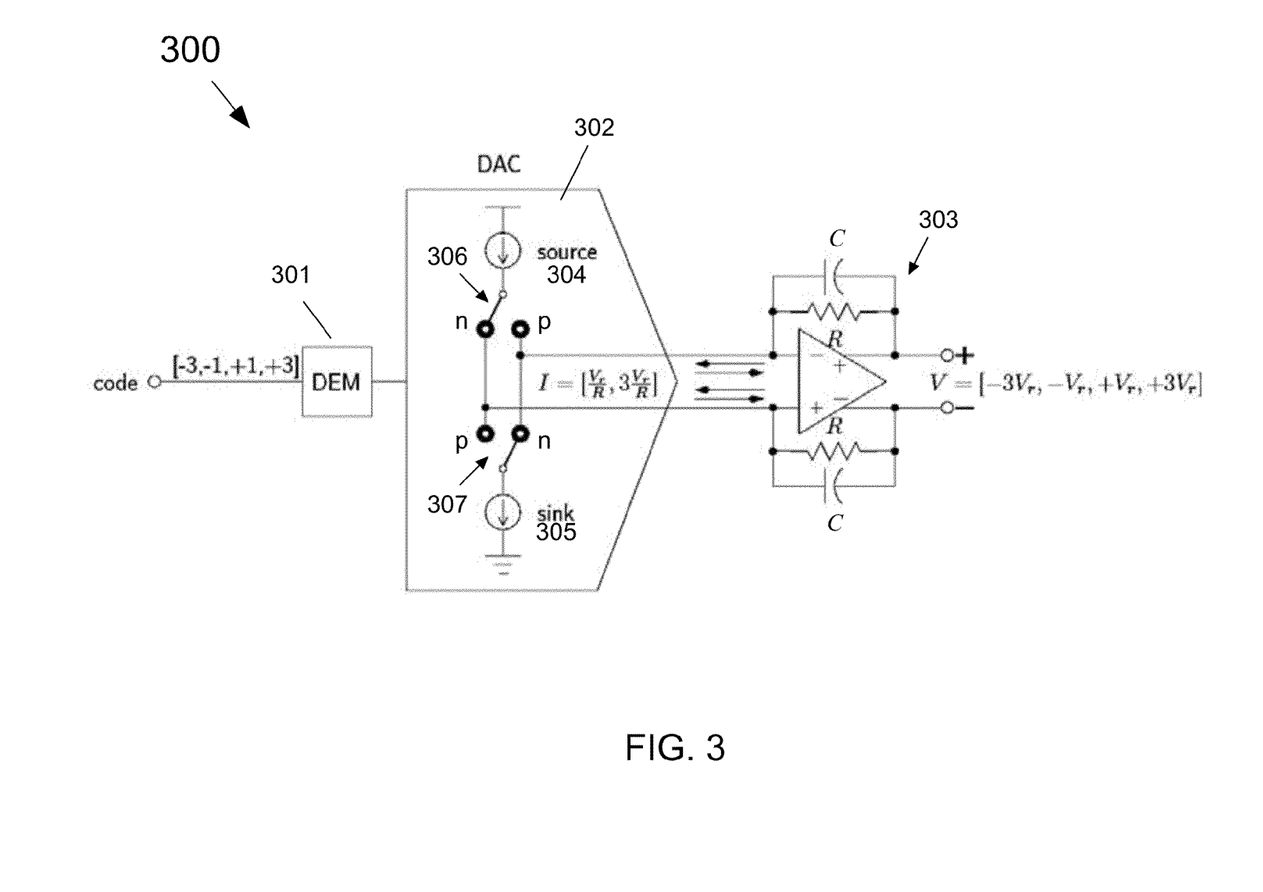
FIG. 3 depicts a functional block diagram of an exemplary embodiment of a true differential-output DAC configuration according to the subject matter disclosed herein.

FIG. 3 depicts a functional block diagram of an exemplary embodiment of a true differential-output DAC configuration 300 according to the subject matter disclosed herein. In comparison to the conventional pseudo-differential DAC configuration 200 shown in FIG. 2, DAC 300 is more efficient in terms of area and power. DAC 300 comprises a DEM 301 coupled to a plurality of DAC elements 302, of which only one DAC element is shown. The output of DAC elements 302 are coupled to filter 303, which provides a true differential-output. Each DAC element 302 comprises a current source 304, a current sink 305, and switches 306 and 307. According to the subject matter disclosed herein, the current through current source 304 is substantially equal to the current through current sink 305. Because each DAC element 302 comprises both a current source and a current sink, the DC-offset current associated with a conventional configuration is eliminated. Moreover, for a minimum input code, only a minimum number of DAC elements are connected to the signal path, thereby also improving noise performance. The values of R and C associated with filter 303 are dependent upon specific design criteria.

A conventional DWA algorithm is not suitable for use with DEM 301 because the code selection mechanism of a conventional DWA algorithm cannot linearly provide a sign change for a DAC element. Each DAC element 302 outputs current in two directions, thereby permitting DEM 301 according to the subject matter disclosed herein to receive an input sign change. The particular direction of a current output by a DAC element 302 is selected by switches 306 and 307. If a DAC element 302 is selected by DEM 301 to be a positive element, switches 306 and 307 are configured to connect to the "p" terminals of the switch. If a DAC element 302 is selected by DEM 301 to be a negative element, switches 306 and 307 are configured to connect to the "n" terminals of the switch. If a DAC element 302 is not selected by DEM 301, both the current source 304 and current sink 305 of the DAC element are disconnected from the DAC output.

In addition to providing DAC elements that can be used with a true differential-output DAC configuration, the subject matter disclosed herein also provides a technique for receiving a signed input code set, generating multiple element selectors that can drive a true differential-output DAC configuration without duplicating DEM circuitry, and providing a first-order mismatch noise shaping.

According to the subject matter disclosed herein, a signed input code is decomposed into a sign and a magnitude value. The sign is used for determining direction (i.e., positive or negative) of the current of the selected DAC elements, and the magnitude value is used for determining the number of DAC elements that are selected and rotated for the input code.

In order to avoid intersymbol interference (ISI), each DAC element must have a return-to-zero phase each time after being selected and used, which is guaranteed by the constraint that any DAC element that has been selected for the previous sample cannot be selected for the current sample. This constraint provides that the minimum number of DAC elements for an N-bit DAC to be $2(2^N-1+2r)$, which means that the rotational bits r need additional DAC elements. In theory, for a particular mismatch distribution, the number of rotational bits r has a slight impact on mismatch noise shaping. In practice, however, a Gaussian distribution of mismatch distribution can be assumed for the DAC elements, and r=1 can be used to minimize the thermal noise floor and the total number of DAC elements.

Figure 4:
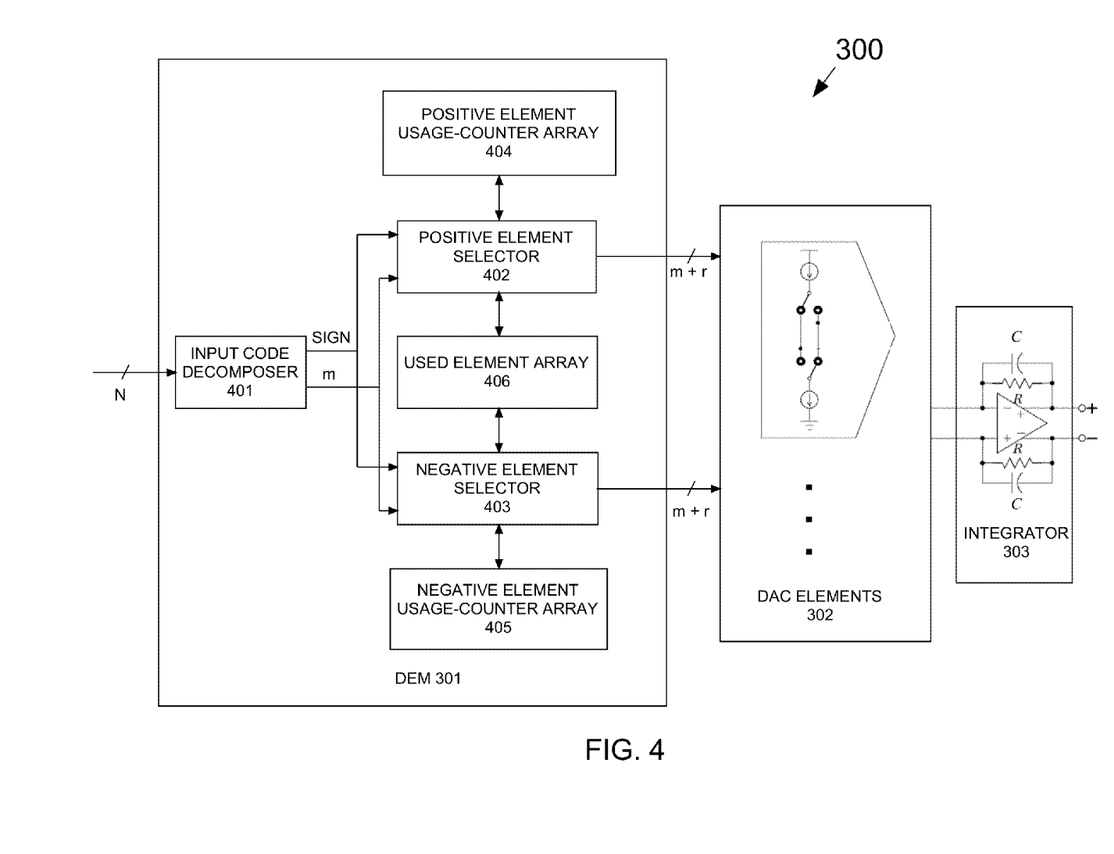
FIG. 4 depicts a functional block diagram of the exemplary embodiment of a true differential-output DAC configuration showing more details for a DEM according to the subject matter disclosed herein.

FIG. 4 depicts a functional block diagram of the exemplary embodiment of a true differential-output DAC configuration 300 showing more details for DEM 301. DEM 301 comprises an input code decomposer 401, a positive element selector 402, a negative element selector 403, a positive element usage counter array 404, a negative element usage counter array 405, and a used-element array 406.

Input code decomposer 401 receives and decomposes an input code into a sign signal and a magnitude signal m. The sign signal and the magnitude signal m are each input to positive element selector 402 and negative element selector 403. The sign signal is used to determine which element selector outputs m+r element selection signals to DAC elements 302, and which element selector outputs r selection signals to DAC elements 302. Magnitude signal m is used to determine the particular DAC elements that are selected. If the sign signal is positive, positive element selector 402 selects DAC elements first, then negative element selector 403 selects DAC elements. If the sign signal is negative, negative element selector 403 selects DAC elements first, and then positive element selector 402 selects DAC elements.

The particular DAC elements 302 that are selected for an input code are determined by usage-counter arrays 404 and 405. Each selector 402 and 403 selects the DAC elements corresponding to a minimum usage count in a usage-counter array starting from the lowest DAC element address, and wrapping back to the beginning DAC element after selecting the last DAC element available having a minimum usage count. If no DAC elements having the minimum usage count in the usage-counter array are available, i.e., no DACs are available that have been selected the minimum number of times, DAC elements having a usage count of minimum +1 in the array are then selected, and so on until enough DAC elements are selected for the input code by the selector (i.e., m+r DAC elements). This process is then repeated for other selectors. This process guarantees that a candidate DAC element cannot be selected by more than one selector for the same input code. That is, for the specific example of a DEM technique disclosed herein that is used for a differential-output DAC, a DAC element cannot be simultaneously selected by both a positive element selector and a negative element selector.

Based on this process, DEM 301 generates a total of m+2r multiple element selector signals for the DAC elements in the plurality of DAC elements 302. If an input code is +m, m+r elements will be selected by the positive element selector, and another r elements will be selected by the negative element selector, so the sum of the output of all elements will be equivalent to +m elements only. Similarly, if input sample code is −m, m+r elements will be selected by the negative element selector, and another r elements will be selected by the positive element selector, so the sum of the output of all elements will be equivalent to −m elements. If a DAC element 302 is selected by DEM 301 to be a positive element, switches 306 and 307 (FIG. 3) are responsive to the selector signals output from positive element selector 402 to be connected to the "p" terminals of the switch. If a DAC element 302 is selected by DEM 301 to be a negative element, switches 306 and 307 (FIG. 3) are responsive to the selector signals output from negative element selector 403 to be connected to the "n" terminals of the switch. If a DAC element 302 is not selected by DEM 301, both the current source 304 and current sink 305 of the DAC element are disconnected from the DAC output.

The number of times a DAC element has been selected in the past by a particular selector is accumulated by the usage-counter array that is associated with the selector. In the case of a DEM used for a differential-output DAC, such as depicted in FIG. 4, two independent usage-counter arrays are used—positive usage-counter array 404 associated with positive element selector 402 and negative usage-counter array 405 associated with negative element selector 403. To avoid usage counter values becoming unbounded, the usage-counter arrays only keep the offset to the minimum count in the array. The minimum count in each array is reset to 0 after each sample, and the other values in the array are reduced by the same value that was used to reset the minimum count to 0.

Figure 5:
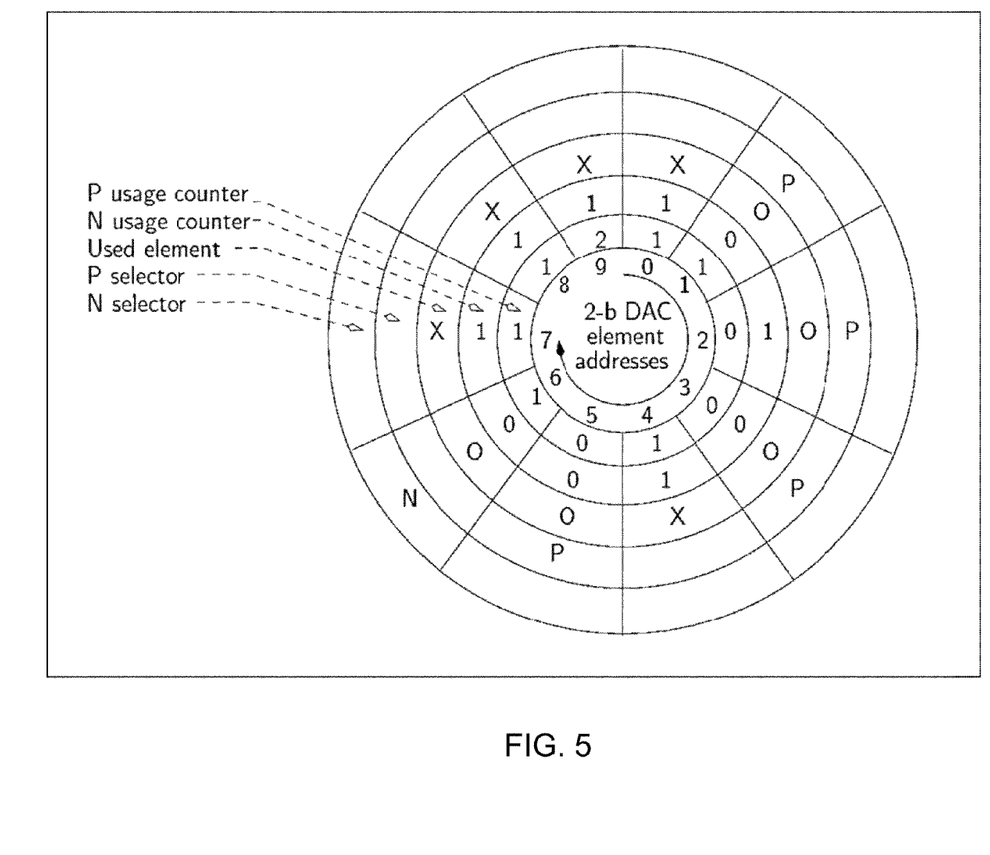
FIG. 5 depicts a snapshot of the state of the DEM according to the subject matter disclosed herein for a 2-bit differential-output DAC after an exemplary input code of +3 is received.

To illustrate this process, reference is made to FIG. 5, which depicts a snapshot of the state of the DEM for a 2-bit differential-output DAC after an exemplary input code of +3 is received. The number of rotational bits has been selected to be r=1. Accordingly, because the DAC is a 2-bit DAC, the minimum number of DAC elements is 10.

In the center of FIG. 5 are the addresses 0-9 for the ten DAC elements. Based on the previously received input code, five DAC elements were selected for the previous digital sample, which happened to be DAC elements (0, 4, 7, 8, 9). Consequently, DAC elements (0, 4, 7, 8, 9) are marked with an X in the Used Element ring, and cannot be selected for the current input code of +3. Because the current input code is +3, the sign is determined to be positive and the magnitude m is determined to be 3. Because the sign is positive, the positive selector selects four DAC elements first and afterward the negative selector selects one DAC element. (If the sign had been determined to be negative, the negative selector would select DAC elements first, followed by the positive selector.)

According to the positive selector usage counter, DAC elements (2, 3, 5) have a minimum usage count of 0, and were not used for the previous sample (i.e., no X in the Used Element ring), so DAC elements [2, 3, 5] are eligible candidates for selection by the positive selector. One more DAC element needs to be selected from the next usage group having a usage count of 1 so that the positive selector selects m+r DAC elements. The first DAC element having a usage count of 1 (i.e., minimum +1) is DAC element 0; however, this DAC element is illegible for selection because DAC element 0 was used for the previous sample. Consequently, the next candidate DAC element, DAC element 1, is selected instead, thereby fulfilling the task of the positive selector. At this point, the negative selector selects one DAC element (i.e., r). DAC Elements (0, 1, 2, 3, 4, 5) are all ineligible for selection because they have either been used in the previous sample (i.e., X in the Used Element ring) or have been currently selected by the positive selector. Consequently, DAC element 6 having a usage count 0 is selected by the negative selector.

As a result, DAC elements (1, 2, 3, 5, 6) are selected by the two selectors for an input code of +3. These particular DAC elements will not be available for the next sample. At the same time, the positive selector usage counter array will be increment by 1 for DAC elements 1, 2, 3 and 5 and the negative selector usage counter array will be incremented by 1 for DAC element 6.

Figure 6:
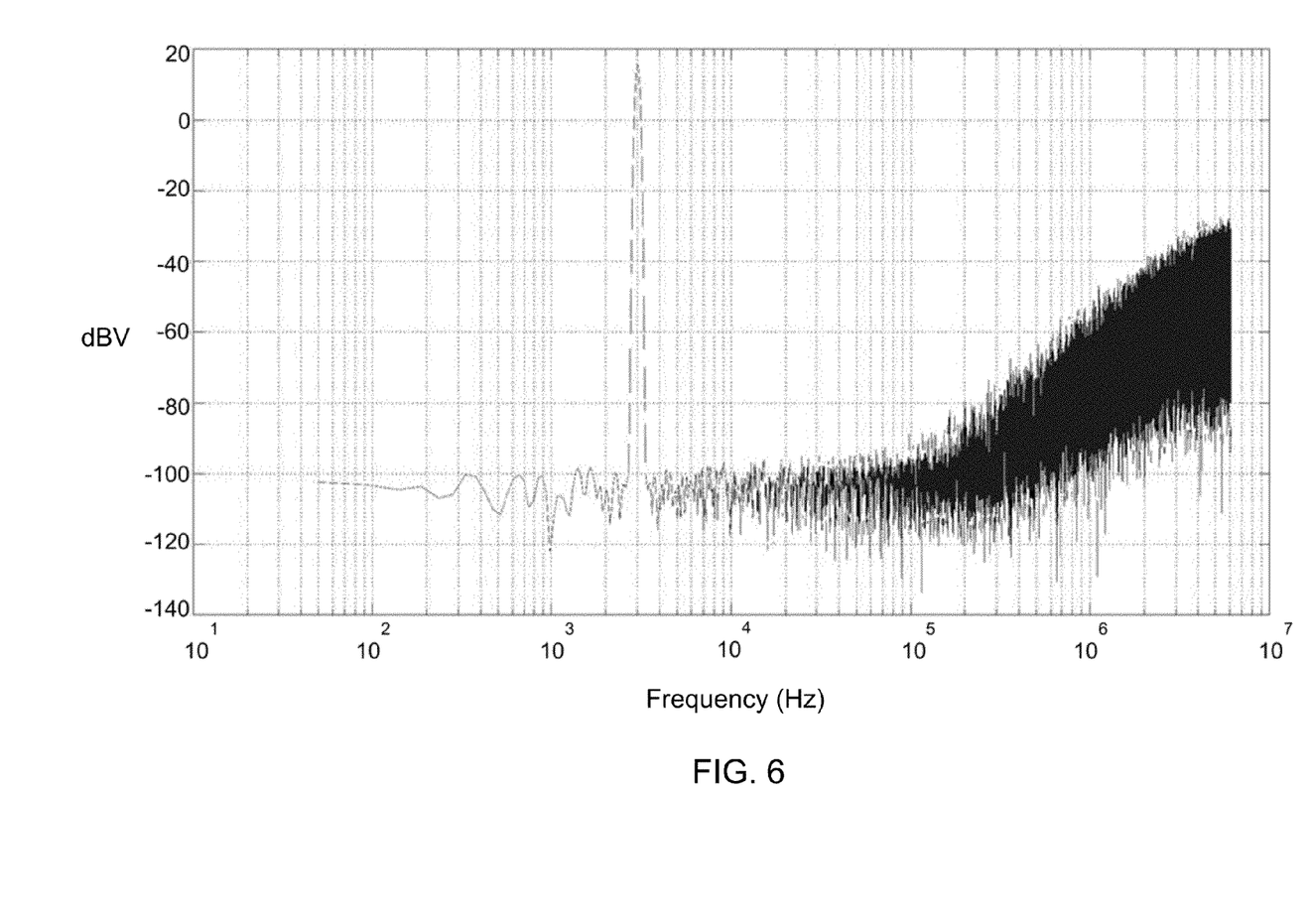
FIG. 6 depicts a simulated output spectrum for a 3 kHz input digital sample sequence for a conventional DWA algorithm used with a 4-bit audio band $\Delta\Sigma$ DAC having a true differential-output configuration and having a 1% element mismatch.

FIG. 6 depicts a simulated output spectrum for a 3 kHz input digital sample sequence for a conventional DWA algorithm used with a 4-bit audio band $\Delta\Sigma$ DAC having a true differential-output configuration (i.e., FIG. 3) and having a 1% element mismatch. The mismatch noise is white and in the audio band, whereas the first-order mismatch noise shaping provided by the conventional the DWA algorithm is lost, that is, the 20 dB/decade roll off that extends to DC, which is the signature of the first-order noise shaping, is lost. In FIG. 6, the mismatch noise is simply randomized and the spectrum is flat below 100 kHz, thereby significantly increasing the integrated noise floor in the signal band.

Figure 7:
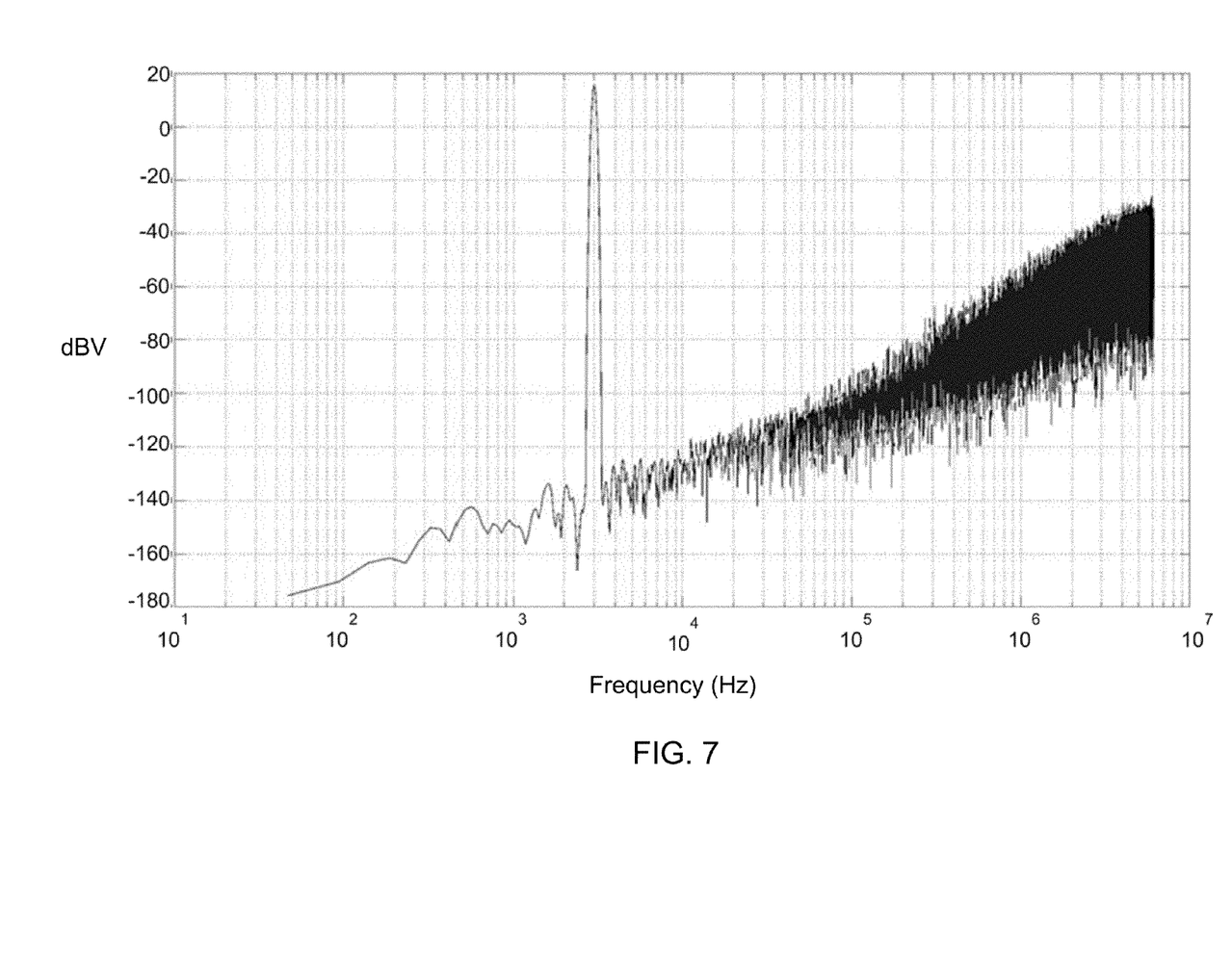
FIG. 7 depicts a simulated output spectrum for a 3 kHz input digital sample sequence for the DEM algorithm disclosed herein used with a 4-bit audio band $\Delta\Sigma$ DAC having a true differential-output configuration and having a 1% element mismatch.

In contrast to FIG. 6, FIG. 7 depicts a simulated output spectrum for a 3 kHz input digital sample sequence for the DEM algorithm disclosed herein used with a 4-bit audio band $\Delta\Sigma$ DAC having a true differential-output configuration (i.e., FIG. 3) and having a 1% element mismatch. Mismatch noise exhibits a first-order noise shaping in the audio band. The spectra of FIGS. 6 and 7 only show DAC-element mismatch noise. Thus, the pseudo-differential DAC configuration (FIG. 2) used with a conventional DWA algorithm and true differential DAC configuration (FIG. 3) used with the DEM technique disclosed herein both have the first-order noise shaping, as shown in FIG. 7. When, however, thermal noise is concerned for a 4-bit DAC, a pseudo-differential DAC configuration used with a conventional DWA algorithm has a thermal noise floor that is five times (i.e., 14 dB) greater than a true differential DAC configuration used with the DEM technique disclosed herein.

Figure 8:
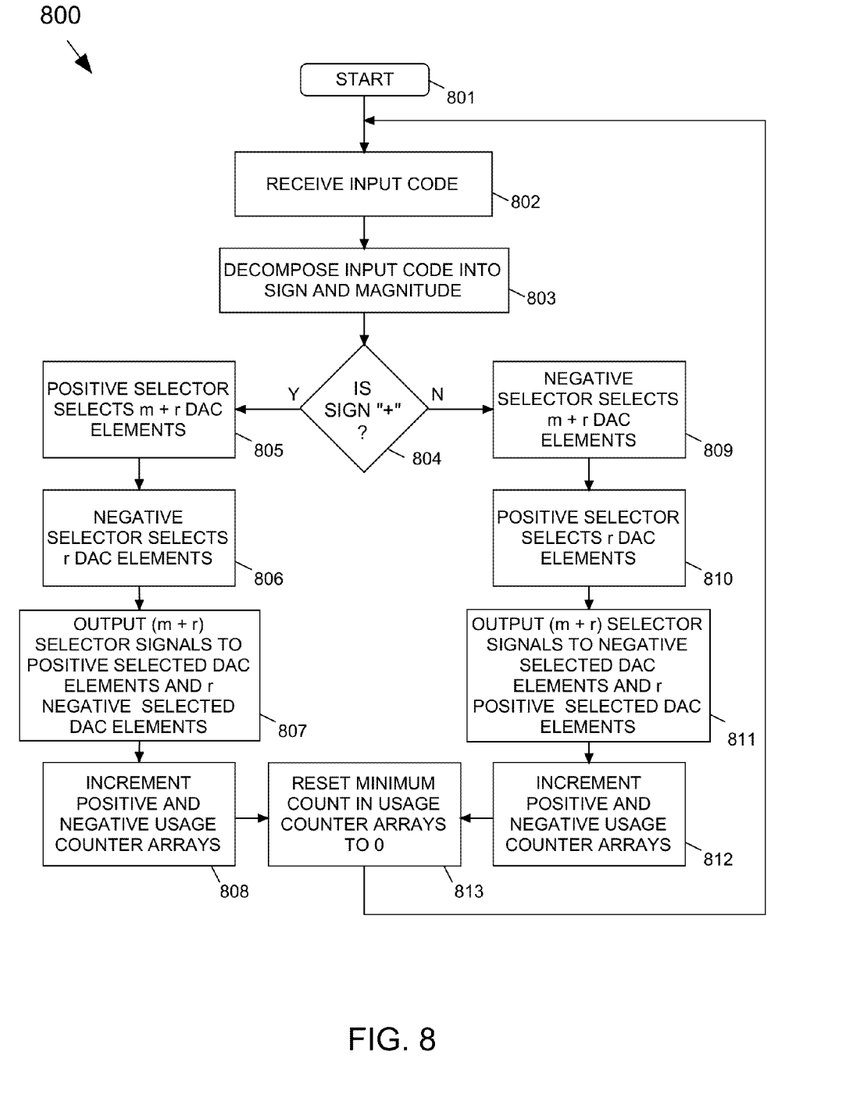
FIG. 8 depicts a flow diagram for an exemplary embodiment of a DEM process according to the subject matter disclosed herein.

FIG. 8 depicts a flow diagram for an exemplary embodiment of a DEM process 800 according to the subject matter disclosed herein. In one exemplary embodiment, an N-bit signed input code set is initially coded into a set of $[-(2^{N-1}), -(2^{N-3}), \ldots, -1, +1, \ldots, +(2^{N-3}), +(2^{N-1})]$. For example, a 4-bit signed code has one of the following values: $[-15, -13, \ldots, -1, +1, \ldots, 13, 15]$. It should be understood that this coding could be done in advance or could be done as input codes are received. It should also be understood that process 800 could be performed by, but not limited to, a state machine or a computing device executing instructions that result in process 800.

The process begins at 801 and at 802, an input code is received. At 803, each received input digital code is decomposed to a sign bit and a corresponding magnitude m value. If, at 804, the sign of an input code is positive, flow continues to 805 where a positive element selector selects m+r DAC elements as positive elements, in which m is the magnitude of the code, and r is the number of rotational elements. At 806, a negative element selector selects r DAC elements as negative elements. At 807, the sum of both positive DAC elements and negative DAC elements provides a net DAC output corresponding to (m+r)−r=m positive DAC elements. At 808, the positive and negative element selector usage counter arrays are incremented. At 813, the usage count in each usage counter array are adjusted so that the minimum usage count is reset to 0 and all other counter array values are decremented by the value used to reset the minimum count to 0. Flow continues to back to 802.

If, at 804, the sign of the input code is negative, flow continues to 809 where the negative element selector selects m+r DAC elements as negative elements. At 810, the positive element selector selects r DAC elements as positive elements. At 811, the sum of both positive DAC elements and negative DAC elements provides a net DAC output corresponding to (m+r)−r=m negative DAC elements. At 812, the positive and negative element selector usage counter arrays are incremented. At 813, the usage count in each usage counter array are adjusted so that the minimum usage count is reset to 0 and all other counter array values are decremented by the value used to reset the minimum count to 0. Flow continues to back to 802.

Figure 9:
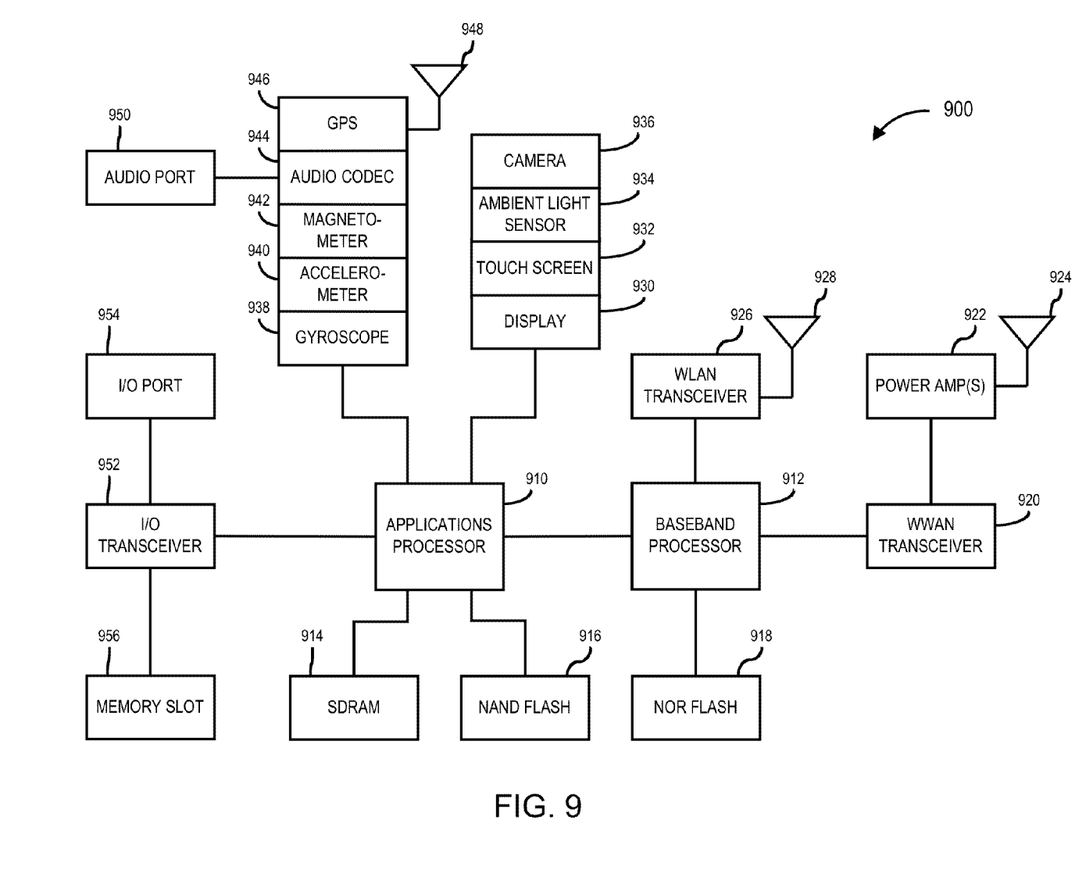
FIG. 9 depicts an exemplary functional block diagram of an information-handling system that is capable of tangibly embodying devices and/or circuitry for dynamically selecting circuit elements for various types of circuits according to the subject matter disclosed herein.

FIG. 9 depicts an exemplary functional block diagram of an information-handling system 900 that is capable of tangibly embodying devices and/or circuitry for dynamically selecting circuit elements for various types of circuits, such as Digital-to-Analog Converters (DACs), delta-sigma (ΔΣ) DACs, analog-to-digital converters (ADCs), ΔΣ ADCs, filters, etc., according to the subject matter disclosed herein. Additionally, information-handling system 900 is capable of tangibly embodying devices, such as Digital-to-Analog Converters (DACs), delta-sigma (ΔΣ) DACs, analog-to-digital converters (ADCs), ΔΣ ADCs, filters, etc., according to the subject matter disclosed herein. Although information-handling system 900 represents one example of several types of computing platforms, information-handling system 900 may include more or fewer elements and/or different arrangements of elements than shown in FIG. 9, and the scope of the claimed subject matter is not limited in these respects.

In one or more embodiments, information-handling system 900 may comprise one or more applications processor 910 and a baseband processor 912. Applications processor 910 may be utilized as a general purpose processor to run applications and the various subsystems for information-handling system 900. Applications processor 910 may include a single core or alternatively may include multiple processing cores wherein one or more of the cores may comprise a digital signal processor or digital signal processing core. Additionally, applications processor 910 may include a graphics processor or coprocessor disposed on the same chip, or alternatively a graphics processor coupled to applications processor 910 may comprise a separate, discrete graphics chip. Applications processor 910 may include on-board memory, such as cache memory, and further may be coupled to external memory devices such as synchronous dynamic random access memory (SDRAM) 914 for storing and/or executing applications, such as capable of dynamically selecting circuit elements for various types of circuits according to the subject matter disclosed herein. During operation, and NAND flash 916 for storing applications and/or data even when information handling system 900 is powered off. Further, applications processor 910 may execute computer-readable instructions stored in SDRAM 914 and/or NAND flash 916 that result in a DEM-DAC process according to the subject matter disclosed herein.

In one exemplary embodiment, baseband processor 912 may control the broadband radio functions for information-handling system 900. Baseband processor 912 may store code for controlling such broadband radio functions in a NOR flash 918. Baseband processor 912 controls a wireless wide area network (WWAN) transceiver 920 which is used for modulating and/or demodulating broadband network signals, for example, for communicating via a 3GPP LTE network or the like as discussed herein with respect to FIG. 9. The WWAN transceiver 920 couples to one or more power amplifiers 922 that are respectively coupled to one or more antennas 924 for sending and receiving radio-frequency signals via the WWAN broadband network. The baseband processor 912 also may control a wireless local area network (WLAN) transceiver 926 coupled to one or more suitable antennas 928 and that may be capable of communicating via a Bluetooth-based standard, an IEEE 802.11-based standard, an IEEE 802.16-based standard, an IEEE 802.18-based wireless network standard, a 3GPP-based protocol wireless network, a Third Generation Partnership Project Long Term Evolution (3GPP LTE) based wireless network standard, a 3GPP2 Air Interface Evolution (3GPP2 AIE) based wireless network standard, a 3GPP-LTE-Advanced-based wireless network, a UMTS-based protocol wireless network, a CDMA2000-based protocol wireless network, a GSM-based protocol wireless network, a cellular-digital-packet-data-based (CDPD-based) protocol wireless network, a Mobitex-based protocol wireless network, a Near-Field-Communications-based (NFC-based) link, a WiGig-based network, a ZigBee-based network, or the like. It should be noted that these are merely exemplary implementations for applications processor 910 and baseband processor 912, and the scope of the claimed subject matter is not limited in these respects. For example, any one or more of SDRAM 914, NAND flash 916 and/or NOR flash 918 may comprise other types of memory technology, such as magnetic-based memory, chalcogenide-based memory, phase-change-based memory, optical-based memory, or ovonic-based memory, and the scope of the claimed subject matter is not limited in this respect.

In one or more embodiments, applications processor 910 may drive a display 930 for displaying various information or data, and may further receive touch input from a user via a touch screen 932, for example, via a finger or a stylus. In one exemplary embodiment, screen 932 display a menu and/or options to a user that are selectable via a finger and/or a stylus for entering information into information-handling system 900.

An ambient light sensor 934 may be utilized to detect an amount of ambient light in which information-handling system 900 is operating, for example, to control a brightness or contrast value for display 930 as a function of the intensity of ambient light detected by ambient light sensor 934. One or more cameras 936 may be utilized to capture images that are processed by applications processor 910 and/or at least temporarily stored in NAND flash 916. Furthermore, applications processor may be coupled to a gyroscope 938, accelerometer 940, magnetometer 942, audio coder/decoder (CODEC) 944, and/or global positioning system (GPS) controller 946 coupled to an appropriate GPS antenna 948, for detection of various environmental properties including location, movement, and/or orientation of information-handling system 900. Alternatively, controller 946 may comprise a Global Navigation Satellite System (GNSS) controller. Audio CODEC 944 may be coupled to one or more audio ports 950 to provide microphone input and speaker outputs either via internal devices and/or via external devices coupled to information-handling system via audio ports 950, for example, via a headphone and microphone jack. In one exemplary embodiment, CODEC 944 is capable of dynamically selecting circuit elements for various types of circuits, such as Digital-to-Analog Converters (DACs), delta-sigma ($\Delta\Sigma$) DACs, analog-to-digital converters (ADCs), $\Delta\Sigma$ ADCs, filters, etc., according to the subject matter disclosed herein. In another exemplary embodiment, CODEC 944 is capable of tangibly embodying devices, such as Digital-to-Analog Converters (DACs), delta-sigma ($\Delta\Sigma$) DACs, analog-to-digital converters (ADCs), $\Delta\Sigma$ ADCs, filters, etc., according to the subject matter disclosed herein.

Applications processor 910 may couple to one or more input/output (I/O) transceivers 952 to couple to one or more I/O ports 954 such as a universal serial bus (USB) port, a high-definition multimedia interface (HDMI) port, a serial port, and so on. Furthermore, one or more of the I/O transceivers 952 may couple to one or more memory slots 956 for optional removable memory, such as secure digital (SD) card or a subscriber identity module (SIM) card, although the scope of the claimed subject matter is not limited in these respects.

Figure 10:
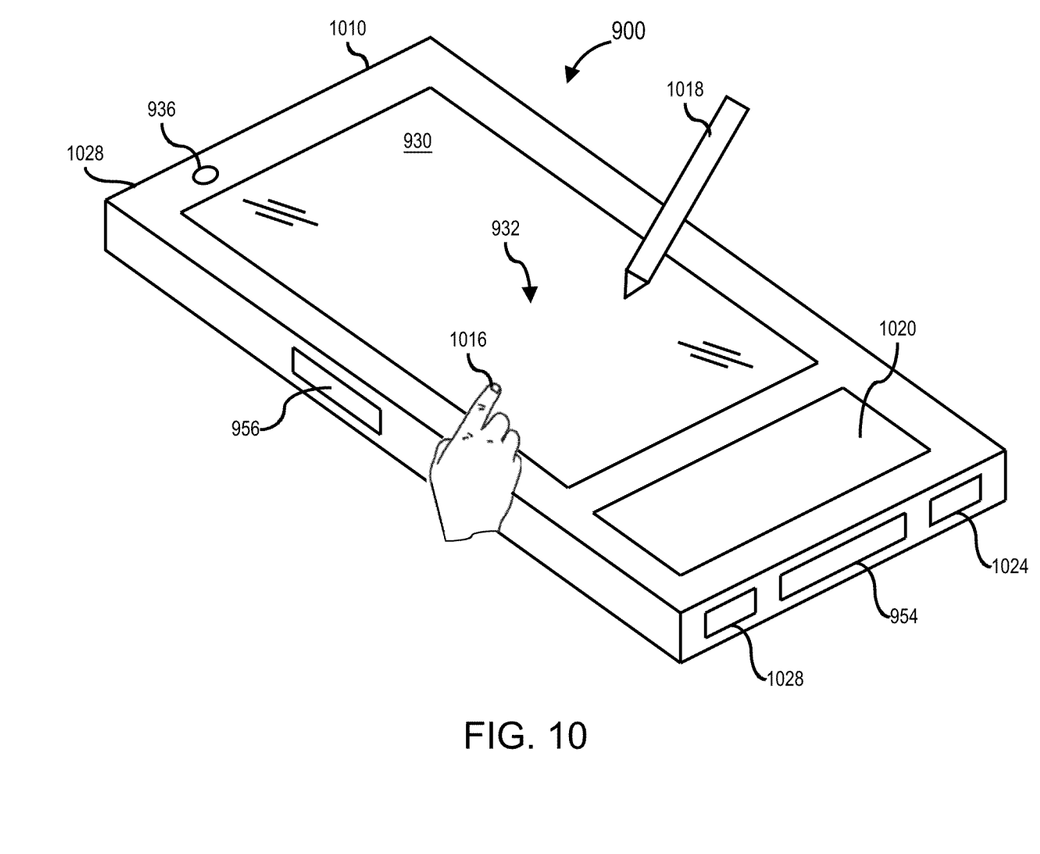
FIG. 10 depicts an isometric view of an exemplary embodiment of the information-handling system of FIG. 9 that optionally may include a touch screen in accordance with one or more embodiments disclosed herein.

FIG. 10 depicts an isometric view of an exemplary embodiment of the information-handling system of FIG. 9 that optionally may include a touch screen in accordance with one or more embodiments disclosed herein. FIG. 10 shows an example implementation of information-handling system 900 of FIG. 9 tangibly embodied as a cellular telephone, smartphone, smart-type device, or tablet-type device or the like, that is may comprise devices, such as Digital-to-Analog Converters (DACs), delta-sigma ($\Delta\Sigma$) DACs, analog-to-digital converters (ADCs), $\Delta\Sigma$ ADCs, filters, etc., according to the subject matter disclosed herein. In one or more embodiments, information-handling system 900 may comprise capability for dynamically selecting circuit elements for various types of circuits according to the subject matter disclosed herein and/or may comprise devices, such as Digital-to-Analog Converters (DACs), delta-sigma ($\Delta\Sigma$) DACs, analog-to-digital converters (ADCs), $\Delta\Sigma$ ADCs, filters, etc., according to the subject matter disclosed herein. Information-handling system 900 may comprise a housing 1010 having a display 930 that may include a touch screen 932 for receiving tactile input control and commands via a finger 1016 of a user and/or a via stylus 1018 to control one or more applications processors 910. Housing 1010 may house one or more components of information-handling system 900, for example, one or more applications processors 910, one or more of SDRAM 914, NAND flash 916, NOR flash 918, baseband processor 912, and/or WWAN transceiver 920. Information-handling system 900 further may optionally include a physical actuator area 1020 which may comprise a keyboard or buttons for controlling information-handling system 900 via one or more buttons or switches. Information-handling system 900 may also include a memory port or slot 956 for receiving non-volatile memory, such as flash memory, for example, in the form of a secure digital (SD) card or a subscriber identity module (SIM) card. Optionally, information-handling system 900 may further include one or more speakers and/or microphones 924 and a connection port 954 for connecting information-handling system 900 to another electronic device, dock, display, battery charger, and so on. Additionally, information-handling system 900 may include a headphone or speaker jack 1028 and one or more cameras 936 on one or more sides of housing 1010. It should be noted that information-handling system 900 of FIGS. 9 and 10 may include more or fewer elements than shown, in various arrangements, and the scope of the claimed subject matter is not limited in this respect.

Figure 11:
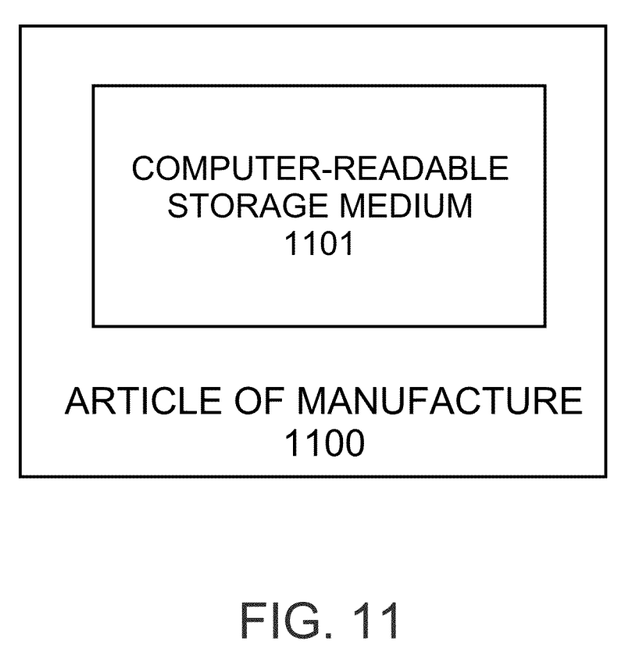
FIG. 11 depicts an exemplary embodiment of an article of manufacture comprising a non-transitory computer-readable storage medium having stored thereon computer-readable instructions that, when executed by a computer-type device, results in any of the various techniques and methods according to the subject matter disclosed herein.

FIG. 11 depicts an exemplary embodiment of an article of manufacture 1100 comprising a non-transitory computer-readable storage medium 1101 having stored thereon computer-readable instructions that, when executed by a computer-type device, results in any of the various techniques and methods according to the subject matter disclosed herein. Exemplary computer-readable storage mediums that could be used for computer-readable storage medium 1101 could be, but are not limited to, a semiconductor-based memory, an optically based memory, a magnetic-based memory, or a combination thereof.

Although the foregoing disclosed subject matter has been described in some detail for purposes of clarity of understanding, it will be apparent that certain changes and modifications may be practiced that are within the scope of the appended claims. Accordingly, the present embodiments are to be considered as illustrative and not restrictive, and the subject matter disclosed herein is not to be limited to the details given herein, but may be modified within the scope and equivalents of the appended claims.

What is claimed is:

1. An apparatus, comprising:
   an input code decomposer capable of determining whether a received input code is a positive or a negative value and a magnitude m of the input code,
   at least one positive element selector; and
   at least one negative element selector,
   if the received input code comprises a positive value,
      the at least one positive element selector being capable of being responsive to the input code decomposer to select m+r eligible candidate circuit elements from a plurality of circuit elements in which r comprises a number of rotational elements, each circuit element being capable of being configured as a positive circuit element or a negative circuit element, each eligible candidate circuit element comprising a circuit element that was not selected for an immediately preceding received N-bit input code and that has a corresponding minimum usage count value, the selected m+r circuit elements intended to be positive output circuit elements, and the at least one negative element selector being capable of being responsive to the input code decomposer to select r remaining eligible candidate circuit elements from the plurality of circuit elements, the remaining eligible candidate circuit elements comprising a circuit element that was not selected for an immediately preceding received N-bit input code, has a corresponding minimum usage count value, and was not one of the selected m+r circuit elements, the selected r circuit elements intended to be negative output circuit elements, and if the received input code comprises a negative value, the at least one negative element selector being capable of being responsive to the input code decomposer to select m+r eligible candidate circuit elements from a plurality of circuit elements in which r comprises a number of rotational elements, each eligible candidate circuit element comprising a circuit element that was not selected for an immediately preceding received N-bit input code and that has a corresponding minimum usage count value, the selected m+r circuit elements intended to be negative output circuit elements, and the at least one positive element selector being capable of being responsive to the input code decomposer to select r remaining eligible candidate circuit elements from the plurality of circuit elements, the remaining eligible candidate circuit elements comprising a circuit element that was not selected for an immediately preceding received N-bit input code, has a corresponding minimum usage count value, and was not one of the selected m+r circuit elements, the selected r circuit elements intended to be positive output circuit elements.

2. The apparatus according to claim 1, wherein the at least one positive element selector is further capable of being responsive to the input code decomposer if the input code comprises a positive value to output m+r selector signals, and wherein the at least one negative element selector is further capable of being responsive to the input code decomposer if the input code comprises a negative value to output m+r selector signals.

3. The apparatus according to claim 2, wherein the selected m+r circuit elements each comprise first and second nodes, wherein if the input digital code comprises a positive value, the selected m+r circuit elements are configured to source a current from the first node and to sink the current into the second node, and wherein if the input digital code comprises a negative value, the selected m+r circuit elements are configured to source a current from the second node and to sink the current into the first node.

4. The apparatus according to claim 3, further comprising a differential-output filter that is capable of converting current to voltage respectively passing through the first and second nodes of the selected m+2r circuit elements, a differential-output signal of the filter corresponding to the sign and the magnitude m of the received N-bit input code.

5. The apparatus according to claim 4, further comprising a plurality of circuit elements.

6. The apparatus according to claim 5, wherein the plurality of circuit elements comprises a minimum of $2(2^N-1+2r)$ circuit elements.

7. The apparatus according to claim 6, wherein the plurality of circuit elements comprising digital-to-analog converter (DAC) elements.

8. The apparatus according to claim 6, wherein the apparatus is a delta-sigma ($\Delta\Sigma$) digital-to-analog converter (DAC).

9. The apparatus according to claim 1, wherein the plurality of circuit elements comprises a minimum of $2(2^N-1+2r)$ circuit elements.

10. The method according to claim 1, wherein the plurality of circuit elements comprise a plurality of digital-to-analog (DAC) circuit elements each capable of a bi-directional current output.

11. A method, comprising:

determining whether a receive N-bit input code is a positive or a negative value;

determining a magnitude m of the input code;

if the input code comprises a positive value, selecting m+r eligible candidate circuit elements from a plurality of circuit elements in which r comprises a number of rotational elements, each circuit element being capable of being configured as a positive circuit element or a negative circuit element, each eligible candidate circuit element comprising a circuit element that was not selected for an immediately preceding received N-bit input code and that has a corresponding minimum usage count value, the selected m+r circuit elements intended to be positive output circuit elements, and selecting r remaining eligible candidate circuit elements from the plurality of circuit elements, the remaining eligible candidate circuit elements comprising a circuit element that was not selected for an immediately preceding received N-bit input code, has a corresponding minimum usage count value, and was not one of the selected m+r circuit elements, the selected r circuit elements intended to be negative output circuit elements; and if the input digital code comprises a negative value, selecting m+r eligible candidate circuit elements from a plurality of circuit elements in which r comprises a number of rotational elements, each circuit element being capable of being configured as a positive circuit element or a negative circuit element, each eligible candidate circuit element comprising a circuit element that was not selected for an immediately preceding received N-bit input code and that has a corresponding minimum usage count value, the selected m+r circuit elements intended to be negative output circuit elements, and selecting r remaining eligible candidate circuit elements from the plurality of circuit elements, the remaining eligible candidate circuit elements comprising a circuit element that was not selected for an immediately preceding received N-bit input code, has a corresponding minimum usage count value, and was not one of the selected m+r circuit elements, the selected r circuit elements intended to be positive output circuit element.

12. The method according to claim 11, further comprising outputting m+r selector signals to the selected m+r circuit elements; and output r selector signals to the selected r circuit elements.

13. The method according to claim 12, wherein the selected m+r circuit elements each comprise first and second nodes, the method further comprising:

if the input digital code comprises a positive value, configuring the selected m+r circuit elements intended to be positive output circuit elements to source current from the first node and to sink current into the second node, and configuring the selected r circuit elements intended to be negative output circuit elements to source current from the second node and sink the current into the first node; and if the input digital code comprises a negative value, configuring the selected m+r circuit elements intended to be negative output circuit elements to source current from the second node and to sink current into the first node, and configuring the selected r circuit elements to source current from the first node and to sink current into the second node.

14. The method according to claim 13, further comprising forming a differential-output signal from the currents respectively passing through the first and second nodes of the selected m+2r circuit elements, the differential-output signal corresponding to the sign and the magnitude m of the received N-bit input code.

15. The method according to claim 14, wherein forming the differential-output signal comprises converting the currents respectively passing through the first and second nodes of the selected m+2r circuit elements into a voltage.

16. The method according claim 15, wherein the plurality of circuit elements comprises a minimum of $2(2^N-1+2r)$ circuit elements.

17. The method according to claim 16, wherein the method is a result of executing instructions stored in a non-transitory computer-readable medium.

18. The method according to claim 12, further comprising:
reducing minimum usage count values to zero after outputting the m+2r selector signals; and
reducing all other usage count values by a value used to reduce the minimum usage count values to zero.

19. The method according to claim 11, wherein the plurality of circuit elements comprises a minimum $2(2^N-1+2r)$ circuit elements.

20. The method according to claim 11, wherein the plurality of circuit elements comprise a plurality of digital-to-analog (DAC) circuit elements each capable of a bi-directional current output.

* * * * *

UNITED STATES PATENT AND TRADEMARK OFFICE
CERTIFICATE OF CORRECTION

PATENT NO. : 8,643,525 B1
APPLICATION NO. : 13/733301
DATED : February 4, 2014
INVENTOR(S) : Jianping Wen et al.

It is certified that error appears in the above-identified patent and that said Letters Patent is hereby corrected as shown below:

In the Claims:

Column 10:
at line 53, replace "a received input code is a positive or a negative value and" with:
--a received N-bit input code is a positive or a negative value and--

Column 12:
at line 62, replace "output r selector signals to the selected r circuit elements." with:
--outputting r selector signals to the selected r circuit elements.--

Signed and Sealed this
Twenty-seventh Day of May, 2014

Michelle K. Lee
*Deputy Director of the United States Patent and Trademark Office*